United States Patent
Shido et al.

(10) Patent No.: US 8,862,811 B2
(45) Date of Patent: Oct. 14, 2014

(54) SEMICONDUCTOR DEVICE PERFORMING BURST ORDER CONTROL AND DATA BUS INVERSION

(71) Applicant: Elpida Memory, Inc., Tokyo (JP)

(72) Inventors: Taihei Shido, Tokyo (JP); Chiaki Dono, Tokyo (JP); Chikara Kondo, Tokyo (JP); Shinya Miyazaki, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 201 days.

(21) Appl. No.: 13/629,328

(22) Filed: Sep. 27, 2012

(65) Prior Publication Data

US 2013/0091327 A1 Apr. 11, 2013

(30) Foreign Application Priority Data

Sep. 29, 2011 (JP) .................................. 2011-214450

(51) Int. Cl.
G06F 12/00 (2006.01)
G11C 7/10 (2006.01)
G11C 11/4096 (2006.01)

(52) U.S. Cl.
CPC .............. *G06F 12/00* (2013.01); *G11C 7/1006* (2013.01); *G11C 7/1012* (2013.01); *G11C 7/1027* (2013.01); *G11C 11/4096* (2013.01)
USPC ......................................................... 711/105

(58) Field of Classification Search
None
See application file for complete search history.

(56) References Cited

U.S. PATENT DOCUMENTS

| | | | |
|---|---|---|---|
| 5,426,606 A | 6/1995 | Takai | |
| RE35,934 E | 10/1998 | Takai | |
| 5,890,005 A * | 3/1999 | Lindholm | ..................... 713/320 |
| 7,405,981 B2 | 7/2008 | Dietrich | |
| 2006/0261929 A1* | 11/2006 | Hein | .......................... 340/146.2 |
| 2010/0077125 A1* | 3/2010 | Park et al. | ..................... 710/310 |
| 2010/0118618 A1* | 5/2010 | Kwak | ..................... 365/189.05 |
| 2013/0061102 A1* | 3/2013 | Sohn et al. | ..................... 714/718 |
| 2013/0132660 A1* | 5/2013 | Li et al. | ......................... 711/105 |

FOREIGN PATENT DOCUMENTS

JP  6-290582 A  10/1994
WO  WO 2013007048 A1 *  1/2013

* cited by examiner

*Primary Examiner* — Kevin Verbrugge
(74) *Attorney, Agent, or Firm* — McGinn IP Law Group, PLLC

(57) ABSTRACT

Disclosed herein is a device that a device including first data lines transmitting a plurality of sequential first data bits, respectively, second data lines transmitting a plurality of sequential second data bits, respectively, third data lines transmitting a plurality of sequential third data bits, respectively, a BOC circuit rearranging order of the plurality of first data bits supplied from the plurality of first data lines in accordance with address information, the BOC circuit supplying the resultant to the plurality of second data lines as the plurality of second data bits, and a DBI circuit performing inversion or non-inversion of the plurality of second data bits supplied from the plurality of second data lines independently of each other in accordance with a predetermined condition, the DBI circuit supplying the resultant to the plurality of third data lines as the plurality of third data bits.

20 Claims, 14 Drawing Sheets

OUTPUT ORDER (n) →

| | D0 | D1 | D2 | D3 | D4 | D5 | D6 | D7 |
|---|---|---|---|---|---|---|---|---|
| DQ0 | 1 | 1 | 1 | 1 | 1 | 1 | 1 | 1 |
| DQ1 | 1 | 1 | 1 | 1 | 1 | 1 | 1 | 0 |
| DQ2 | 1 | 1 | 1 | 1 | 1 | 1 | 0 | 0 |
| DQ3 | 1 | 1 | 1 | 1 | 1 | 0 | 0 | 0 |
| DQ4 | 1 | 1 | 1 | 1 | 0 | 0 | 0 | 0 |
| DQ5 | 1 | 1 | 1 | 0 | 0 | 0 | 0 | 0 |
| DQ6 | 1 | 1 | 0 | 0 | 0 | 0 | 0 | 0 |
| DQ7 | 1 | 0 | 0 | 0 | 0 | 0 | 0 | 0 |

DATA INPUT/OUTPUT TERMINAL (m) ↓

FIG.3A

OUTPUT ORDER (n) →

| | D0 | D1 | D2 | D3 | D4 | D5 | D6 | D7 |
|---|---|---|---|---|---|---|---|---|
| DQ0 | 1 | 1 | 1 | 1 | 1 | 0 | 0 | 0 |
| DQ1 | 1 | 1 | 1 | 1 | 1 | 0 | 0 | 1 |
| DQ2 | 1 | 1 | 1 | 1 | 1 | 0 | 1 | 1 |
| DQ3 | 1 | 1 | 1 | 1 | 1 | 1 | 1 | 1 |
| DQ4 | 1 | 1 | 1 | 1 | 0 | 1 | 1 | 1 |
| DQ5 | 1 | 1 | 1 | 0 | 0 | 1 | 1 | 1 |
| DQ6 | 1 | 1 | 0 | 0 | 0 | 1 | 1 | 1 |
| DQ7 | 1 | 0 | 0 | 0 | 0 | 1 | 1 | 1 |
| DBI | 1 | 1 | 1 | 1 | 1 | 0 | 0 | 0 |

DATA INPUT/OUTPUT TERMINAL (m) ↓

GENERATING DBI DATA

INVERSION

SEMICONDUCTOR DEVICE PERFORMING BURST ORDER CONTROL AND DATA BUS INVERSION

BACKGROUND OF THE INVENTION

1. Field of the Invention

The present invention relates to a semiconductor device, and more particularly to a semiconductor device that performs burst order control (BOC) and data bus inversion (DBI). The present invention also relates to a data processing system including such a semiconductor device.

2. Description of Related Art

DDR3, the dominant standard of dynamic random access memory (DRAM), and the next-generation standard DDR4 use a technology called BOC for suitable random access. For example, by BOC with a burst length of eight, the output order of eight bits of read data to be consecutively output from a data input/output terminal is rearranged according to three bits of column address Y0, Y1, and Y2 that are input from an external controller. The external controller can thus take out the pieces of data stored in memory cells in a desired order. BOC is not applied to write data. Japanese Patent Application Laid-Open No. H06-290582 discloses an example of BOC.

DDR4 is expected to include an additional technology called DBI. According to the DBI technology, eight bits (DQ0 to DQ7) of read data to be simultaneously output are all inverted if five or more of the eight bits are "0". Since "1" consumes less power than "0" for transmission, DBI can be employed to reduce power consumption. By DBI, one bit of DBI data indicating whether eight bits of read data are inverted is output with the eight bits of read data. The DBI data is output through a dedicated terminal (DBI terminal) which is provided separate from data input/output terminals for outputting the read data. DBI is also applied to write data. At the time of writing, the DRAM performs internal processing for restoring inverted bits based on DBI data input from the controller. U.S. Pat. No. 7,405,981 discloses a general example of DBI different from that of the DDR4 specifications.

A DDR4 DRAM includes a BOC circuit and a DBI circuit for implementing the foregoing BOC and DBI, respectively. At the time of reading, 64 bits of read data read from the memory array are initially supplied to the DBI circuit through a read/write bus RWBUS_ARAY which includes 64 bus lines. The DBI circuit inverts the supplied 64 bits of read data when needed, and outputs the resultant to the BOC circuit with additional eight bits of DBI data. The BOC circuit rearranges the output order of a total of 72 bits of data, including the 64 bits of read data and the eight bits of DBI data, according to the column address Y0, Y1, and Y2. The BOC circuit outputs the resultant to a data input/output circuit through a read/write bus RWBUS_DQ and a read/write bus RWBUS_DBI.

According to such a configuration, the BOC circuit needs to be provided for each of nine output terminals, including eight data input/output terminals and the DBI terminal. In other words, nine BOC circuits are needed. Since the BOC circuits include a large number of transfer gates, the provision of as many as nine BOC circuits (the ninth BOC circuit) increases the circuit area. Also, the higher power consumption also needs a reduction of the BOC circuits.

SUMMARY

In one embodiment, there is provided a device that includes: a plurality of first data lines transmitting a plurality of first data bits; a plurality of second data lines transmitting a plurality of second data bits; a plurality of third data lines transmitting a plurality of third data bits; a BOC circuit converting the first data bits into the second data bits by rearranging order of the first data bits based on address information; a DBI circuit converting the second data bits into the third data bits by performing inversion or non-inversion in logic level of each of the second data bits based on a predetermined rule; and an output circuit outputting the third data bits in serial.

In another embodiment, there is provided a device that includes: a memory array outputting first read data; a BOC circuit rearranging order of the first read data to generate second read data; a DBI circuit inverting one or ones of the second read data in logic level in accordance with a predetermined rule to generate third read data; and a plurality of data input/output terminals outputting the third read data to outside.

In still another embodiment, there is provided a data processing system according to an aspect of the present invention includes: a semiconductor device including a plurality of first data lines that transmit a plurality of sequential first data bits, respectively, a plurality of second data lines that transmit a plurality of sequential second data bits, respectively, a plurality of third data lines that transmit a plurality of sequential third data bits, respectively, a BOC circuit that rearranges order of the plurality of first data bits supplied from the plurality of first data lines in accordance with address information, and supplies the resultant to the plurality of second data lines as the plurality of second data bits, and a DBI circuit that performs inversion or non-inversion of the plurality of second data bits supplied from the plurality of second data lines independently of each other in accordance with a predetermined condition, and supplies the resultant to the plurality of third data lines as the plurality of third data bits; and a controller that controls the semiconductor device.

In still another embodiment, there is provided a device that includes: a burst order control circuit configured to receive a first data signal and then a second data signal, each of the first and second data signals including a plurality of bits, and output the second data signal and then the first data signal based on a control signal; and an inversion control circuit configured to receive the second data signal and then the first data signal and output the second data signal and then the first data signal, the bits of one of the second and first data signals being non-inverted based on a first information and the bits of the other of the bits of the second and first data signal being inverted based on a second information, the first and second information being obtained from the respective bits of the second and first data signals, the first and second information being output from the inversion control circuit.

BRIEF DESCRIPTION OF THE DRAWINGS

FIG. 3A shows a specific example of read data DQ[63:0] supplied to the DBI circuit 18 shown in FIG. 1;

FIG. 3B shows the state after the inversion of the read data DQ[63:0] shown in FIG. 3A by the DBI circuit 18 shown in FIG. 1;

DETAILED DESCRIPTION OF THE EMBODIMENTS

An embodiment of the present invention will be described below. It will be understood that what the present invention claims are not limited to such an embodiment. Specifically, a semiconductor device according to the embodiment of the present invention includes: a plurality of first data lines (drwbus_in) that transmit a plurality of sequential (ordered) first data bits (64 bits of read data prefetched from a memory cell), respectively; a plurality of second data lines (drwbus_out) that transmit a plurality of sequential second data bits, respectively; a plurality of third data lines (RWBUS_DQ) that transmit a plurality of sequential third data bits, respectively; and a plurality of fourth data lines (RWBUS_DBI) that transmit a plurality of sequential fourth data bits, respectively. The semiconductor device according to the embodiment of the present invention further includes: a BOC circuit that rearranges order of the plurality of first data bits (read data DQ) supplied from the plurality of first data lines in accordance with address information, and supplies the resultant to the plurality of second data lines as the plurality of second data bits; and a DBI circuit that inverts the plurality of second data bits supplied from the plurality of second data lines in accordance with a predetermined condition, supplies the resultant to the plurality of third data lines as the plurality of third data bits, generates determination bits (DBI data) indicating information of the inversion (information indicating whether bits are inverted or not), and supplies the determination bits to the plurality of fourth data lines as the plurality of fourth data bits. Since the DBI data is not passed through a BOC circuit, the number of BOC circuits can be reduced accordingly. Specifically, eight BOC circuits are enough. This can reduce the circuit area and power consumption.

Figure 1:
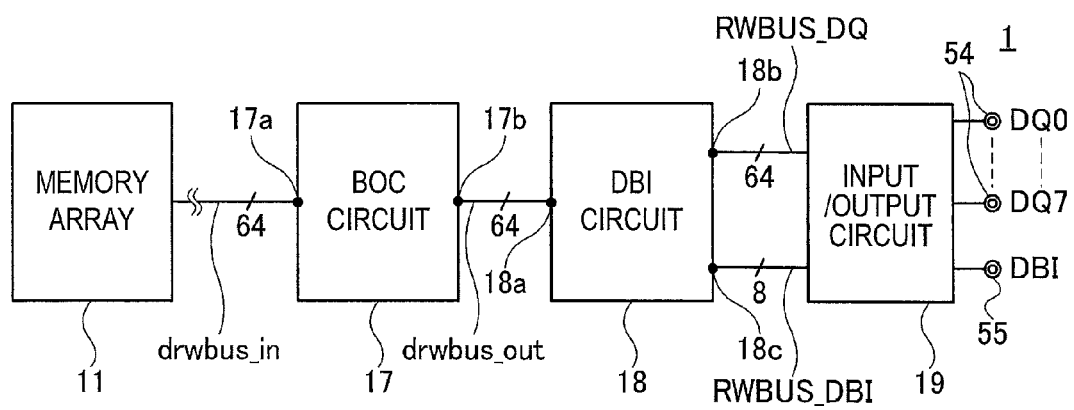
FIG. 1 is a schematic diagram for explaining an embodiment of the present invention.

Referring now to FIG. 1, a semiconductor device 1 according to the embodiment of the present invention includes a memory array 11, a BOC circuit 17, a DBI circuit 18, and an input/output circuit 19. As shown in the diagram, the BOC circuit 17 includes two input/output nodes 17a and 17b. The DBI circuit 18 includes three input/output nodes 18a to 18c. In the following description, expressions z[x:0] and z[y] may be used. The former expression represents that there are (x+1), or 0th to xth, components z. The latter represents the yth component among a plurality of components z.

Figure 5:
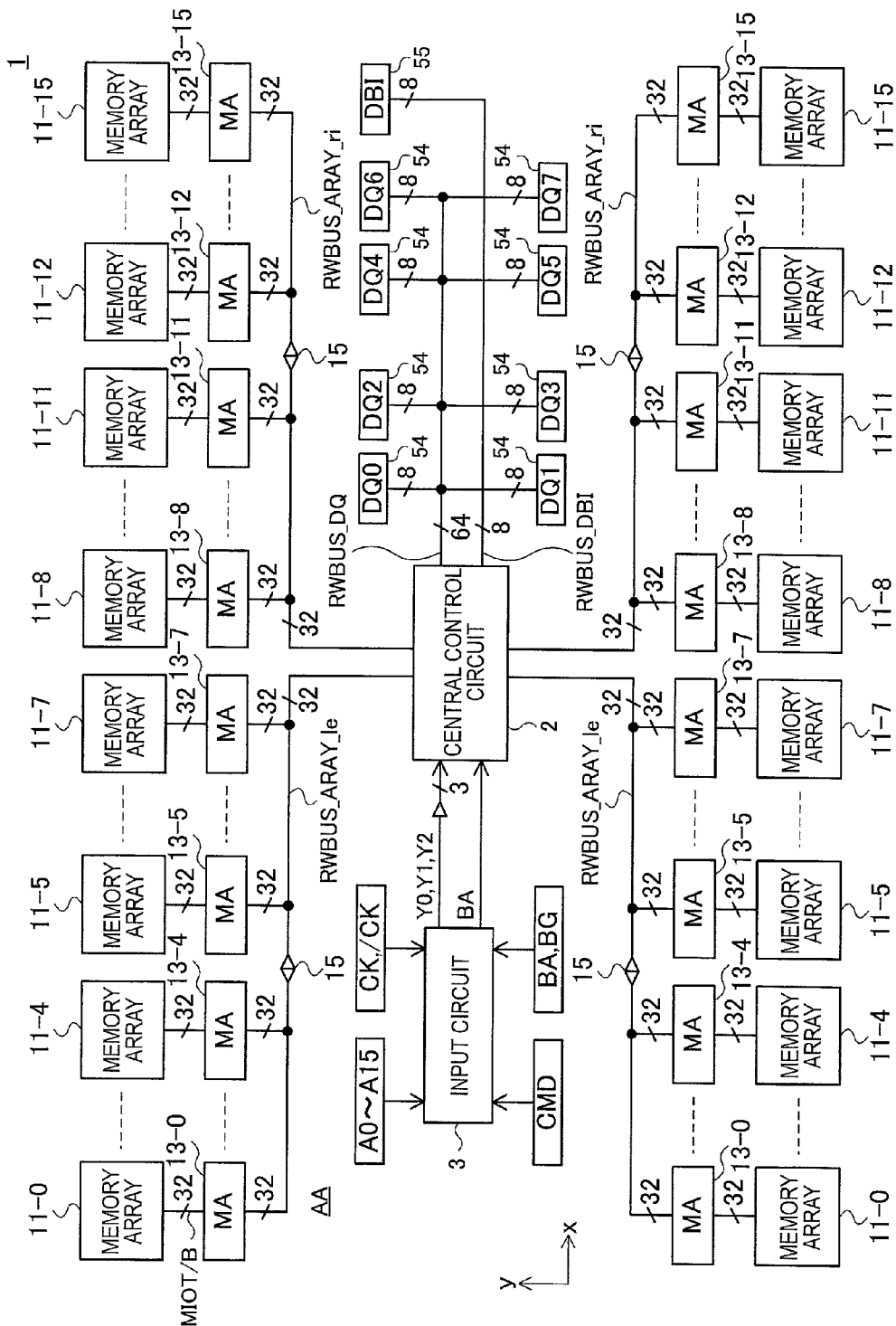
FIG. 5 is a plan view of the semiconductor device 1 shown in FIG. 4.

The memory array 11 is connected to the input/output node 17a of the BOC circuit 17 through 64 lines of a data bus drwbus_in[63:0] (first data lines). The input/output node 17b of the BOC circuit 17 and the input/output node 18a of the DBI circuit 18 are connected to each other through 64 lines of a data bus drwbus_out[63:0] (second data lines). The input/output node 18b of the DBI circuit 18 is connected to the input/output circuit 19 through 64 lines of a read/write bus RWBUS_DQ[63:0] (third data lines). The input/output node 18c of the DBI circuit 18 is connected to the input/output circuit 19 through eight lines of a read/write bus RWBUS_DBI[7:0] (fourth data lines). The input/output circuit 19 is connected to an external controller through eight data input/output terminals 54[7:0] (DQ0 to DQ7) and a DBI terminal 55. Note that the data bus drwbus_out (second data lines) is shorter than the data bus drwbus_in (first data lines). The data bus drwbus_out (second data lines) is also shorter than RWBUS_DQ (third data lines). In other words, the BOC circuit 17 and the DBI circuit 18 are juxtaposed to efficiently process the large number of relevant signal lines. Details are shown in FIG. 5 to be seen later.

Figures 2A, 2B:
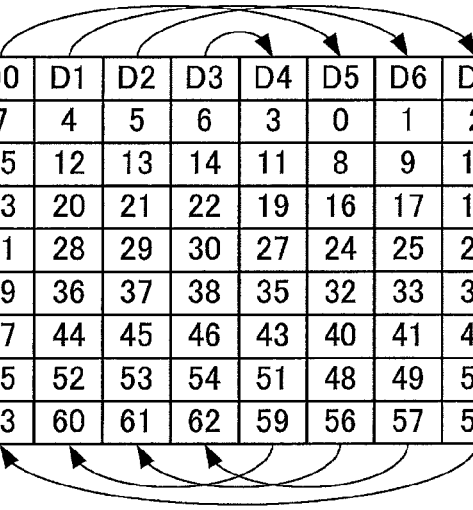
FIG. 2A shows 64 bits of read data DQ[63:0] which are prefetched from memory cells in the memory array 11 shown in FIG. 1 and supplied to the data bus drwbus_in[63:0] shown in FIG. 1 one by one.
FIG. 2B is a diagram showing an example of rearrangement by the BOC circuit 17 shown in FIG. 1.

Hereinafter, a description will be given of the case of reading data from the memory array 11 (at the time of reading). As shown in FIG. 2A, eight sequential bits (for example, 0 to 7) of the 64-bit read data DQ[63:0] are output in the output order (n) from each of the eight data input/output terminals 54[7:0] (DQ0 to DQ7). The eight sequential bits are referred to as burst data. Meanwhile, eight parallel bits (for example, 0, 8, 16, 24, 32, 40, 48, and 56) corresponding to the eight data input/output terminals 54[7:0] (DQ0 to DQ7) are output in each order (n) of output. The eight parallel bits represent the I/O width. The same holds for FIGS. 2B, 3A, and 3B to be seen later. The 64 bits of read data DQ[63:0] are thus composed of a matrix of a plurality of bits expressed by the output order (n) representing the time axis and the I/O width for simultaneous output. In FIG. 2A, a piece of read data DQ that is the nth output from the mth data input/output terminal 54[m] is referred to as read data DQ[8m+n]. Here, m and n both are an integer of 0 to 7. The read data DQ[8m+n] is prefetched from the memory array 11 and then supplied to the BOC circuit 17 through the data bus drwbus_in[8m+n].

The BOC circuit 17 is a circuit that rearranges the order (output order) of the pieces of read data DQ[63:0] in accordance with designations from the external controller. The BOC circuit 17 is provided for each data input/output terminal 54, and has no function of switching the data input/output terminals 54 to output.

In the example shown in FIG. 2B, n=0, 1, 2, 3, 4, 5, 6, and 7 correspond to k=7, 4, 5, 6, 3, 0, 1, and 2, respectively, where k is the output order before rearrangement. The rearranged read data DQ[8m+n] (=the read data DQ[8m+k] before rearrangement) is supplied to the DBI circuit 18 through the data bus drwbus_out[8m+n].

The DBI circuit 18 is a circuit that inverts the pieces of read data DQ[63:0] supplied from the data bus drwbus_out[63:0] in accordance with a predetermined condition. The inversion is processed in units of eight parallel bits (column by column of burst data). Specifically, the following processing is performed at each value of the output order n (D0 to D7). The DBI circuit 18 initially acquires eight bits of read data DQ[8·0+n] to DQ[8·7+n] supplied from the data bus drwbus_out[8·0+n] to drwbus_out[8·7+n]. If five or more of the bits are "0", the DBI circuit 18 inverts all the eight bits of acquired read data. The data inversion and non-inversion are controlled for each value of the output order n (D0 to D7) independently.

In the example shown in FIG. 3A, the number of pieces of read data having a value of "0" among eight pieces of read data DQ[8·0+n] to DQ[8·7+n] corresponding to n increases by one, starting at zero, with each increase of n by one, starting at zero. In such an example, the number of pieces of read data having a value of "0" is five or more when n≥5.

As shown in FIG. 3B, the DBI circuit 18 inverts the read data when n≥5 because the number of pieces of read data having a value of "0" is five or more when n≥5. Consequently, the number of pieces of read data having a value of "0" is smaller than or equal to the half (four) for any n.

The DBI circuit 18 also has the function of generating determination bits (DBI data DBI[7:0]) that indicate information of the inversion (information indicating whether bits are inverted or not). The DBI data DBI is generated for each value of the output order n. As shown in FIG. 3B, specific values of the DBI data DBI[7:0] are suitably "1" for n where the read data is inverted, and "0" for n where the read data is not inverted.

The read data DQ[8m+n] passed through the DBI circuit 18 is supplied to the read/write bus RWBUS_DQ[8m+n]. The DBI circuit 18 also outputs the generated DBI data DBI [n] to the respective lines of the read/write bus RWBUS_DBI[n].

The input/output circuit 19 is a circuit that assigns eight bits (n=0 to 7) of read data DQ[8 m+n] to each of the eight data input/output terminals 54 [m] (m=0 to 7), and outputs the read data DQ[8m+n] to outside from n=0 to n=7 in succession (burst output) through the assigned data input/output terminal 54. The output is conducted in synchronization between the assigned data input/output terminals 54. The input/output circuit 19 also has the function of outputting the DBI data DBI[n] from the DBI terminal 55 to outside in synchronization with the output of the read data DQ[8m+n].

As described above, the semiconductor device 1 includes the DBI circuit 18 between the BOC circuit 17 and the input/output circuit 19. Since no DBI data passes through the BOC circuit 17, the semiconductor device 1 does not have to include a BOC circuit 17 for rearranging the order of the DBI data. This can reduce the circuit area and power consumption as compared to the prior art where a BOC circuit is provided to rearrange the order of DBI data.

Hereinafter, a preferred embodiment of the present invention will be described in detail with reference to the accompanying drawings.

Figure 4:
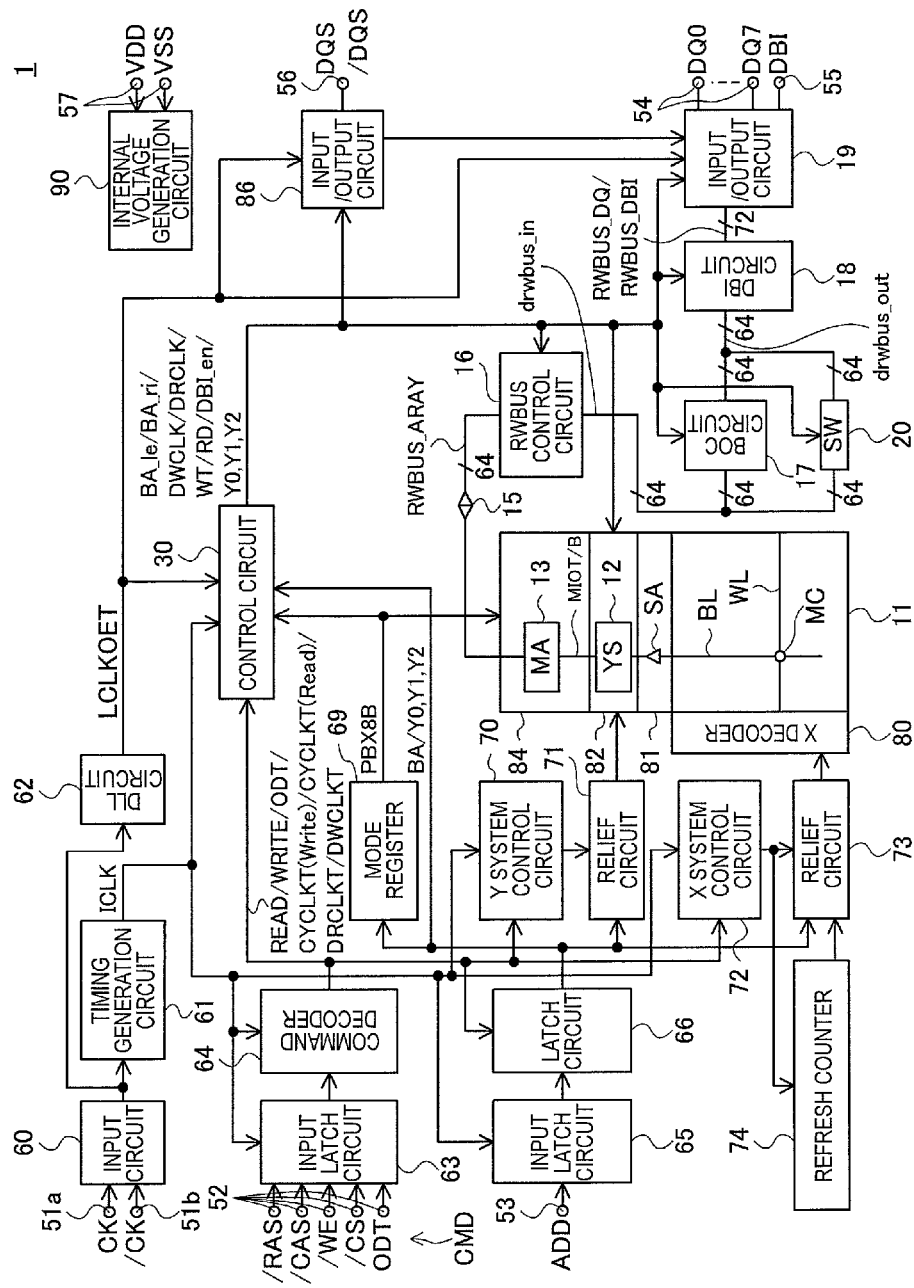
FIG. 4 is a block diagram showing the configuration of a semiconductor device 1 according to the preferred embodiment of the present invention.

Turning to FIG. 4, the semiconductor device 1 according to the present embodiment is a DDR4 SDRAM. The semiconductor device 1 has external terminals including clock terminals 51a and 51b, command terminals 52, an address terminal 53, data input/output terminals 54, a DBI terminal 55, a data strobe terminal 56, and power supply terminals 57.

The clock terminals 51a and 51b are terminals to which external clock signals CK and /CK are supplied, respectively. The supplied external clock signals CK and /CK are supplied to a timing generation circuit 61 and a DLL circuit 62 through an input circuit 60. As employed herein, a signal having a signal name with a leading "/" is either the inverted signal of the corresponding signal or a low-active signal. The external clock signals CK and /CK are therefore complementary to each other. The timing generation circuit 61 generates a single-phase internal clock signal ICLK based on the external clock signals CK and /CK, and supplies the internal clock signal ICLK to circuits in the semiconductor device 1.

The DLL circuit 62 is a clock generation circuit that receives the external clock signals CK and /CK and generates an internal clock signal LCLKOET which is phase-controlled with respect to the external clock signals CK and /CK and is duty-controlled. The generated internal clock signal LCLKOET is supplied to a control circuit 30 and input/output circuits 19 and 86 to be described later.

The command terminals 52 are terminals to which various types of command signals CMD are supplied, including a row address strobe signal /RAS, a column address strobe signal /CAS, a write enable signal /WE, a chip select signal /CS, and an on-die termination signal ODT. The command signals CMD are supplied to a command decoder 64 through an input latch circuit 63.

The command decoder 64 is a circuit that generates various types of internal commands from the input command signals CMD and supplies the internal commands to circuits in the semiconductor device 1. The various types of internal commands to be generated include the following: a read command READ which provides an instruction to enter a read mode; a write command WRITE which provides an instruction to enter a write mode; an on-die termination command ODT which indicates whether on-die termination is ON or OFF; a control command CYCLKT (Read) which controls the operation of column switches 12 at the time of reading; a control command CYCLKT(Write) which controls the operation of the column switches 12 at the time of writing; a control command DRCLKT which controls the operation timing of a RWBUS control circuit 16, a BOC circuit 17, a DBI circuit 18, the input/output circuit 19, and the like at the time of reading; and a control command DWCLKT which controls the operation timing of the RWBUS control circuit 16, a switch 20, the DBI circuit 18, the input/output circuit 19, and the like at the time of writing.

The address terminal 53 is a terminal to which an address signal ADD is supplied. The supplied address signal ADD is supplied to a latch circuit 66 through an input latch circuit 65. The address signal ADD includes a row address X0 to X11, a column address Y0 to Y9 and Y11, and a bank address BA. The latch circuit 66 latches the address signal ADD supplied to the input latch circuit 65. The latch circuit 66 supplies the row address X0 to X11 and the bank address BA to a relief circuit 73, and the column address Y0 to Y9 and Y11 and the bank address BA to a relief circuit 71. The latch circuit 66 also supplies the bank address BA and the column address Y0, Y1, and Y2 to the control circuit 30 to be described later.

In case the semiconductor device 1 is in mode register setting, the address signal ADD input from the external controller is supplied to a mode register 69. The content stored in the mode register 69 is thereby updated. The information stored in the mode register 69 includes an operation mode signal PBX8B which pertains to the number of data input/output terminals 54 to use. The number of data input/output terminals 54 to use, indicated by the operation mode signal PBX8B, is either four (×4 operation) or eight (×8 operation). The operation mode signal PBX8B is extracted by the control circuit 30 to be described later.

The row address and the column address are addresses for determining memory cells to access by identifying a word line WL and bit lines BL in the memory array 11, respectively. As will be described later, the memory array 11 is divided and arranged in 16 banks. The bank address BA is an address for identifying any one of the banks. The memory array 11 includes a plurality of word lines WL and a plurality of bit lines BL which intersect each other. Memory cells MC are arranged at the intersections (FIG. 4 shows only one of the word lines WL, one of the bit lines BL, and one of the memory cells MC). The bit lines BL are connected to corresponding sense amplifiers SA in a sense circuit 81.

The relief circuit 73 stores row addresses corresponding to defective word lines WL and row addresses corresponding to redundant word lines WL being replacements for the defective word lines WL in association with each other for each bank address BA. The relief circuit 73 stores such addresses by using antifuse elements or fuse elements.

An X system control circuit 72 instructs the relief circuit 73 to output a row address in response to the activation of the read command READ or the write command WRITE. Receiving the instruction, the relief circuit 73 outputs the row address supplied from the latch circuit 66 to a row decoder (X decoder) 80 corresponding to the bank address BA supplied from the latch circuit 66 in principle. However, in case the row address supplied from the latch circuit 66 is one stored as a row address corresponding to a defective word line WL, the relief circuit 73 outputs a row address corresponding to the replacing redundant word line WL to the row decoder 80 instead of the supplied row address. Based on the row address input thus, the row decoder 80 selects one of the word lines WL included in the memory array 11. The cell capacitors of the memory cells MC connected to the selected word line WL are connected to the bit lines BL.

The relief circuit 71 stores column address corresponding to defective bit lines BL and column addresses corresponding to redundant bit lines BL being replacements for the defective bit lines BL in association with each other for each bank address BA. Again, the relief circuit 71 stores such addresses by using antifuse elements or fuse elements.

A Y system control circuit 70 instructs the relief circuit 71 to output a column address in response to the activation of the read command READ or the write command WRITE. Receiving the instruction, the relief circuit 71 outputs the column address supplied from the latch circuit 66 to a column decoder (Y decoder) 82 corresponding to the bank address BA supplied from the latch circuit 66 in principle. However, in case the column address supplied from the latch circuit 66 is one stored as a column address corresponding to a defective bit line BL, the relief circuit 71 outputs a column address corresponding to the replacing redundant bit line BL to the column decoder 82 instead of the supplied column address. Based on the column address input thus, the column decoder 82 generates a column select signal (signal for selecting some of the bit lines BL included in the memory array 11) and outputs the column select signal to the column switches 12 in the column decoder 82. The column switches 12 connect the bit lines BL selected by the input column select signal to complementary main I/O lines MIOT/B. The sense amplifiers SA corresponding to the selected bit lines BL are connected to main amplifiers 13 in a main amplifier circuit 84 through the complementary main I/O lines MIOT/B.

The semiconductor device 1 also includes a refresh counter 74. The refresh counter 74 is a circuit that automatically generates a row address. In a refresh operation, the row address generated by the refresh counter is supplied to the relief circuit 73, and a refresh operation is performed on the memory cells MC that are identified by the row address.

The data input/output terminals 54 are terminals for outputting read data DQ and inputting write data DQ. The semiconductor device 1 includes eight data input/output terminals 54[7:0]. For a ×8 operation, the semiconductor device 1 uses all the eight data input/output terminals 54[7:0] to simultaneously input or output eight bits of data. For a ×4 operation, the semiconductor device 1 uses only the four data input/output terminals 54[3:0] to simultaneously input or output four bits of data.

The DBI terminal 55 is a terminal for outputting and inputting DBI data. The DBI terminal 55 is configured so that a single bit can be input/output at a time.

The transfer path of the read data DQ from the memory array 11 to the data input/output terminals 54 includes, in order from the side of the memory array 11, the following: the sense circuit 81, the column decoder 82, the main amplifier circuit 84, an intermediate buffer 15, the RWBUS control circuit 16, the BOC circuit 17, the DBI circuit 18, and the input/output circuit 19. The transfer path of the write data DQ from the data input/output terminals 54 to the memory array 11 includes, in order from the side of the data input/output terminals 54, the following: the input/output circuit 19, the DBI circuit 18, the switch 20, the RWBUS control circuit 16, the intermediate buffer 15, the main amplifier circuit 84, the column decoder 82, and the sense amplifier 81.

The timing for the input/output circuit 19 to fetch the write data DQ from the data input/output terminals 54 is controlled by complementary data strobe signals DQS and /DQS which are supplied from the data strobe terminal 56 through the input/output circuit 86. At the time of reading, the input/output circuit 86 generates the complementary data strobe signals DQS and /DQS, which serve as the reference of operation for data output, and outputs the complementary data strobe signals DQS and /DQS to outside through the data strobe terminal 56.

The control circuit 30 is a circuit that receives the read command READ, the write command WRITE, the on-die termination command ODT, the control command CYCLKT (Read), the control command CYCLKT (Write), the control command DRCLKT, and the control command DWCLKT from the command decoder 64, the bank address BA and the column address Y0, Y1, and Y2 from the latch circuit 66, and the operation mode signal PBX8B from the mode register 69. Based on such commands and signals, the control circuit 30 controls the operation of the column switches 12, the RWBUS control circuit 16, the BOC circuit 17, the DBI circuit 18, and the input/output circuit 19.

As for the column switches 12, the control circuit 30 activates column switches 12 that are included in the bank selected by the bank address BA among the 16 banks, and deactivates the other column switches 12. As a result, only the memory array 11 of the bank selected by the bank address BA is connected to a read/write bus RWBUS_ARAY to be described later. At the time of reading, the control circuit 30 controls the operating timing of the column switches 12 according to the control command CYCLKT(Read). At the time of writing, the control circuit 30 controls the operation timing of the column switches 12 according to the control command CYCLKT(Write).

The control unit 30 controls the operation of the foregoing circuits other than the column switches 12 by generating the following signals: The control circuit 30 activates either one of a left bank activation signal BA_le and a right bank activation signal BA_ri in accordance with the bank address BA. The control circuit 30 also generates a write control clock signal DWCLK based on the control command DWCLKT, and generates a read control clock signal DRCLK based on the control command DRCLKT. The control circuit 30 activates a write control signal WT in response to the activation of the write command WRITE, and activates a read control signal RD in response to the activation of the read command READ. The control circuit 30 activates a DBI enable signal DBI_en if the operation mode signal PBX8B indicates a "×8 operation," and deactivates the DBI enable signal DBI_en if the operation mode signal PBX8B indicates a "×4 operation." The signals will be detailed in detail later.

The power supply terminals 57 are terminals to which external power supply voltages VDD and VSS are supplied. An internal voltage generation circuit 90 generates various types of internal voltages based on the external power supply voltages VDD and VSS, and supplies the internal voltages to the circuits in the semiconductor device 1.

The overall configuration of the semiconductor device 1 according to the present embodiment has been described so far. Next, the planar arrangement of the circuits constituting the semiconductor device 1 will be described.

Turning to FIG. 5, the semiconductor device 1 includes 16 banks that include respective memory arrays 11-0 to 11-15 shown in the diagram. The memory arrays 11-0 to 11-15 each include two portions, i.e., one (first memory array) arranged closer to one end (upper in the diagram) of the semiconductor device 1 in a y direction (second direction) and one (second memory array) arranged closer to the other end (lower in the diagram) of the semiconductor device 1 in the y direction. The upper and lower portions are arranged in respective rows in a bank order from one end (left in the diagram) to the other end (right in the diagram) of the semiconductor device 1 in an x direction.

A wiring area AA for arranging various circuits and wiring is provided between the portions of the memory arrays arranged to the bottom in the diagram and those of the memory arrays arranged to the top in the diagram. The wiring area AA includes: main amplifiers 13-0 to 13-15 for the respective memory arrays; a central control circuit 2 including the BOC circuit 17 (FIG. 4); an input circuit 3 including the command decoder 64 (FIG. 4); the eight data input/output terminals 54 corresponding to DQ0 to DQ7, respectively; and the DBI terminal 55.

The main amplifiers 13-0 to 13-15 are main amplifiers corresponding to the memory arrays 11-0 to 11-15, respectively. The main amplifiers 13-0 to 13-15 are also divided and arranged to the top and bottom in the diagram so as to correspond to the portions of the memory arrays. The main amplifiers 13-0 to 13-15 are connected to the corresponding memory arrays 11-0 to 11-15 through 64 main I/O lines MIOT/B (32 upper lines and 32 lower lines in the diagram) each.

The central control circuit 2 is arranged near the center of the wiring area AA. The central control circuit 2 includes the RWBUS control circuit 16, the BOC circuit 17, the DBI circuit 18, and the control circuit 30 shown in FIG. 4. The RWBUS control circuit 16 is connected to the main amplifiers 13-0 to 13-15 through 64 lines of a read/write bus RWBUS_ARAY.

The read/write bus RWBUS_ARAY includes 64 lines of a left read/write bus RWBUS_ARAY_le (fifth data lines) and 64 lines of a right read/write bus RWBUS_ARAY_ri (sixth data lines). The 64 lines of the left read/write bus RWBUS_ARAY_le include portions extending straight from the central control circuit 2 to one end (left in the diagram) of the semiconductor device 1 in the x direction (first direction), and are connected to the main amplifiers 13-0 to 13-7 on the way. Similarly, the 64 lines of the right read/write bus RWBUS_ARAY_ri include portions extending straight from the central control circuit 2 to the other one end (right in the diagram) of the semiconductor device 1 in the x direction, and are connected to the main amplifiers 13-8 to 13-15 on the way. The main amplifiers are thus connected with the common read/write bus RWBUS_ARAY. Since the memory arrays 11 other than that selected by the bank address BA are disconnected from the read/write bus RWBUS_ARAY by the control circuit 30 as described above, the number of main amplifiers simultaneously connected to the RWBUS control circuit 16 is one.

The 64 lines of the left read/write bus RWBUS_ARAY_le each include an intermediate buffer 15 between the portion where the main amplifier 13-4 is connected and the portion where the main amplifier 13-5 is connected. Similarly, the lines of the right read/write bus RWBUS_ARAY_ri each include an intermediate buffer 15 between the portion where the main amplifier 13-11 is connected and the portion where the main amplifier 13-12 is connected. The intermediate buffers 15 are provided for the purpose of preventing the signals from attenuation during passage through the read/write bus RWBUS_ARAY.

The input circuit 3 is arranged closer to one end (left in the diagram) of the semiconductor device 1 in the x direction as seen from the central control circuit 2. Although not explicitly shown in FIG. 5, a group of first pads including a group of address pads connected to the address terminal 53 and a group of command pads connected to the command terminals 52 is arranged near the input circuit 3 in the wiring area AA. The input circuit 3 includes the input latch circuit 65 and the latch circuit 66 shown in FIG. 4. As shown in FIG. 5, the input circuit 3 functions to supply the bank address BA, the column address Y0, Y1, and Y2, and the like to the central control circuit 2.

The eight data input/output terminals 54 and the DBI terminal 55 are arranged closer to the other end (right in the diagram) of the semiconductor device 1 in the x direction as seen from the central control circuit 2. Although not explicitly shown in FIG. 5, portions of the input/output circuit 19 shown in FIG. 4 corresponding to the data input/output terminals 54 and the DBI terminal 55 are arranged near the respective terminals. A group of second pads including groups of DQ pads respectively connected to the data input/output terminals 54 and the DBI terminal 55 is also arranged near the terminals. The data input/output terminals 54 are connected to the DBI circuit 18 in the central control circuit 2 through eight lines of the read/write bus RWBUS_DQ each. The DBI terminal 55 is connected to the DBI circuit 18 in the central control circuit 2 through the eight lines of the read/write bus RWBUS_DBI.

Figure 6:
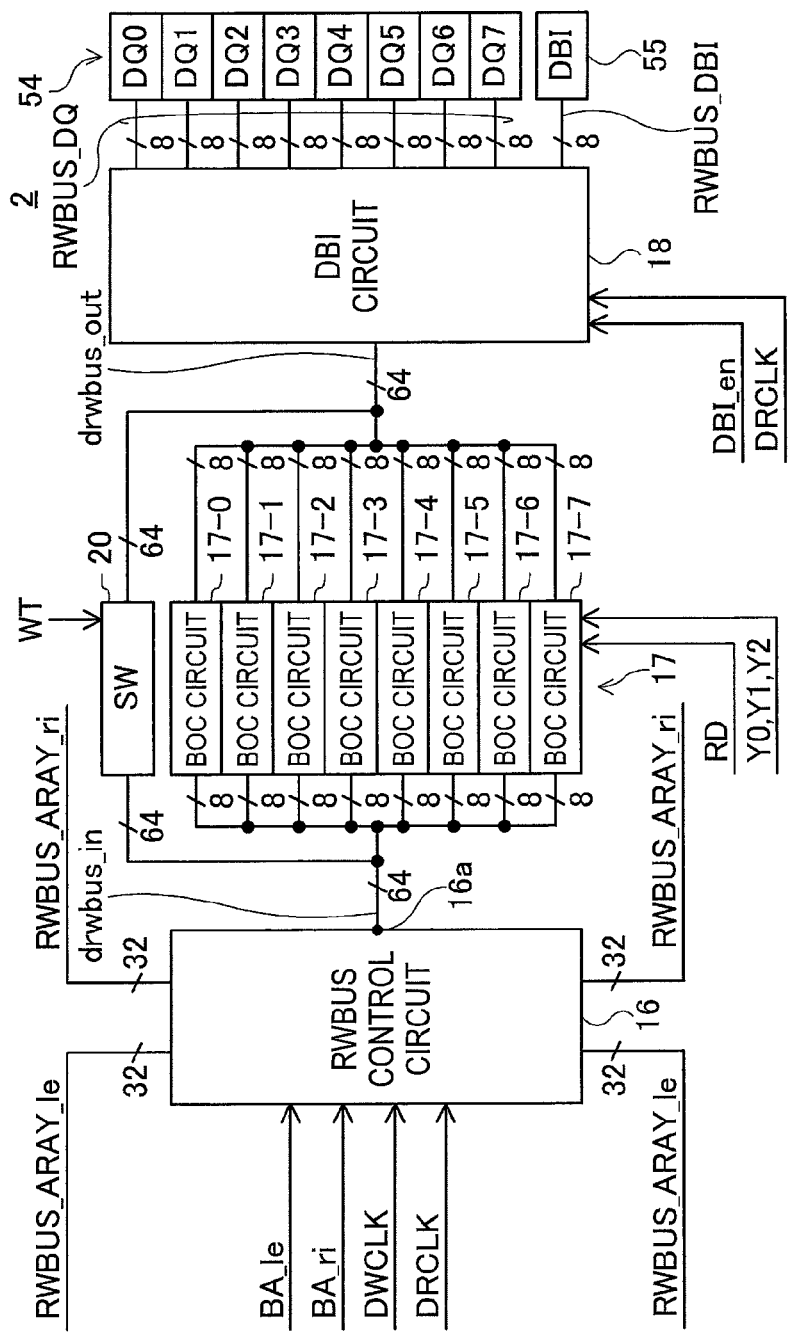
FIG. 6 is a block diagram showing the internal configuration of apart of the central control circuit 2 shown in FIG. 5.

Turning to FIG. 6, the left bank activation signal BA_le, the right bank activation signal BA_ri, the write control clock signal DWCLK, the read control clock signal DRCLK, the write control signal WT, the read control signal RD, and the DBI enable signal DBI_en are signals generated by the control circuit 30 as described above.

The RWBUS control circuit 16 has an input/output node 16a which is connected to the 64 lines of the data bus drwbus_in. The left bank activation signal BA_le, the right bank activation signal BA_ri, the write control clock signal DWCLK, and the read control clock signal DRCLK are supplied from the control circuit 30 to the RWBUS control circuit 16. The RWBUS control circuit 16 is a circuit (multiplexer) that connects the 64 lines of the data bus drwbus_in with either the 64 lines of the left read/write bus RWBUS_ARAY_le or the 64 lines of the right read/write bus RWBUS_ARAY_ri based on the signals supplied from the control circuit 30.

Figure 7:
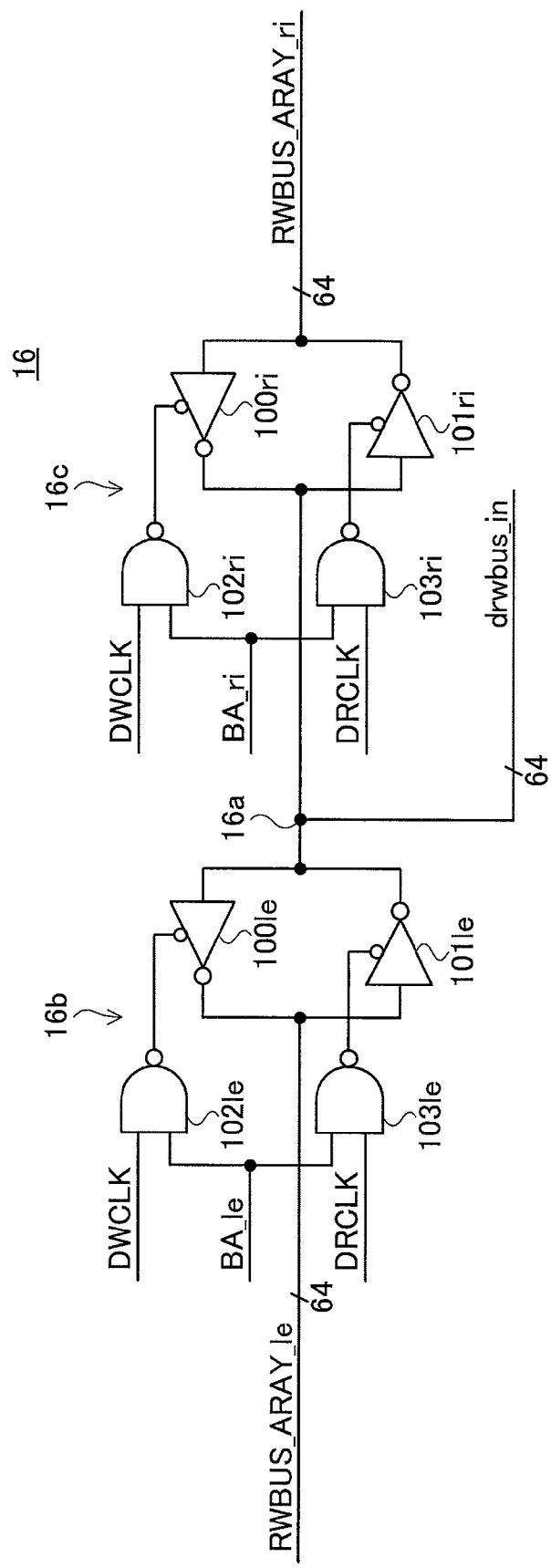
FIG. 7 is a circuit diagram of the RWBUS control circuit 16 shown in FIG. 6.

As shown in FIG. 7, the RWBUS control circuit 16 includes a select circuit 16b which is arranged between the input/output node 16a and the left read/write bus RWBUS_ARAY_le, and a select circuit 16c which is arranged between the input/output node 16a and the right read/write bus RWBUS_ARAY_ri. Although not explicitly shown in the diagram, the select circuit 16b is provided for each of the 64 lines of the left read/write bus RWBUS_ARAY_le. The select circuit 16c is provided for each of the 64 lines of the right read/write bus RWBUS_ARAY_ri.

As shown in FIG. 7, the select circuit 16b includes inverter circuits 1001e and 1011e and NAND circuits 1021e and 1031e. Similarly, the select circuit 16c includes inverter circuits 100ri and 101ri and NAND circuits 102ri and 103ri.

The write control clock signal DWCLK is supplied to the NAND circuits 1021e and 102ri. The read control clock signal DRCLK is supplied to the NAND circuits 1031e and 103ri. The left bank activation signal BA_le is supplied to the NAND circuits 1021e and 1031e. The right bank activation signal BA_ri is supplied to the NAND circuits 102ri and 103ri. The output signals of the NAND circuits 1021e, 102ri, 1031e, and 103ri are inverted and supplied to the inverter circuits 1001e, 100ri, 1011e, and 101ri, respectively.

The output terminal of the inverter circuit 1001e and the input terminal of the inverter circuit 1011e are connected in common to the corresponding line of the left read/write bus RWBUS_ARAY_le. The input terminal of the inverter circuit 1001e and the output terminal of the inverter circuit 1011e are connected in common to the corresponding line of the data bus drwbus_in. Similarly, the output terminal of the inverter circuit 100ri and the input terminal of the inverter circuit 101ri are connected in common to the corresponding line of the right read/write bus RWBUS_ARAY_ri. The input terminal of the inverter circuit 100ri and the output terminal of the inverter circuit 101ri are connected in common to the corresponding line of the data bus drwbus_in.

With such a configuration, either one of the left read/write bus RWBUS_ARAY_le and the right read/write bus RWBUS_ARAY_ri corresponding to the memory array 11 selected by the bank address BA is connected to the data bus drwbus_in through the inverter circuits 1001e or 100ri at the time of writing, and through the inverter circuits 1011e or 101ri at the time of reading. The memory array 11 selected by the bank address BA is thereby connected to the 64 lines of the data bus drwbus_in.

Return to FIG. 6. The BOC circuit 17 includes eight BOC circuits 17-0 to 17-7, which are each connected with eight lines of the data bus drwbus_in and eight lines of the data bus drwbus_out. Specifically, the BOC circuit 17-0 is connected with the data bus drwbus_in[7:0] and the data bus drwbus_out[7:0]. The BOC circuit 17-1 is connected with the data bus drwbus_in[15:8] and the data bus drwbus_out[15:8]. The same holds for the other BOC circuits 17-2 to 17-7. The central control circuit 2 also includes a bypass circuit that connects the data bus drwbus_in and the data bus drwbus_out through the switch 20 instead of the BOC circuit 17.

The column address Y0, Y1, and Y2 and the read control signal RD are supplied to the BOC circuits 17-0 to 17-7. The write control signal WT is supplied to the switch 20. The BOC circuits 17-0 to 17-7 are configured to operate (perform rearrangement) only when the read control signal RD is activated. The switch 20 is configured to operate (pass signals) only when the write control signal WT is activated. As a result, the BOC circuit 17 becomes active only at the time of reading. At the time of writing, the write data is passed through the bypass circuit via the switch 20, skipping the BOC circuit 17.

Figure 8:
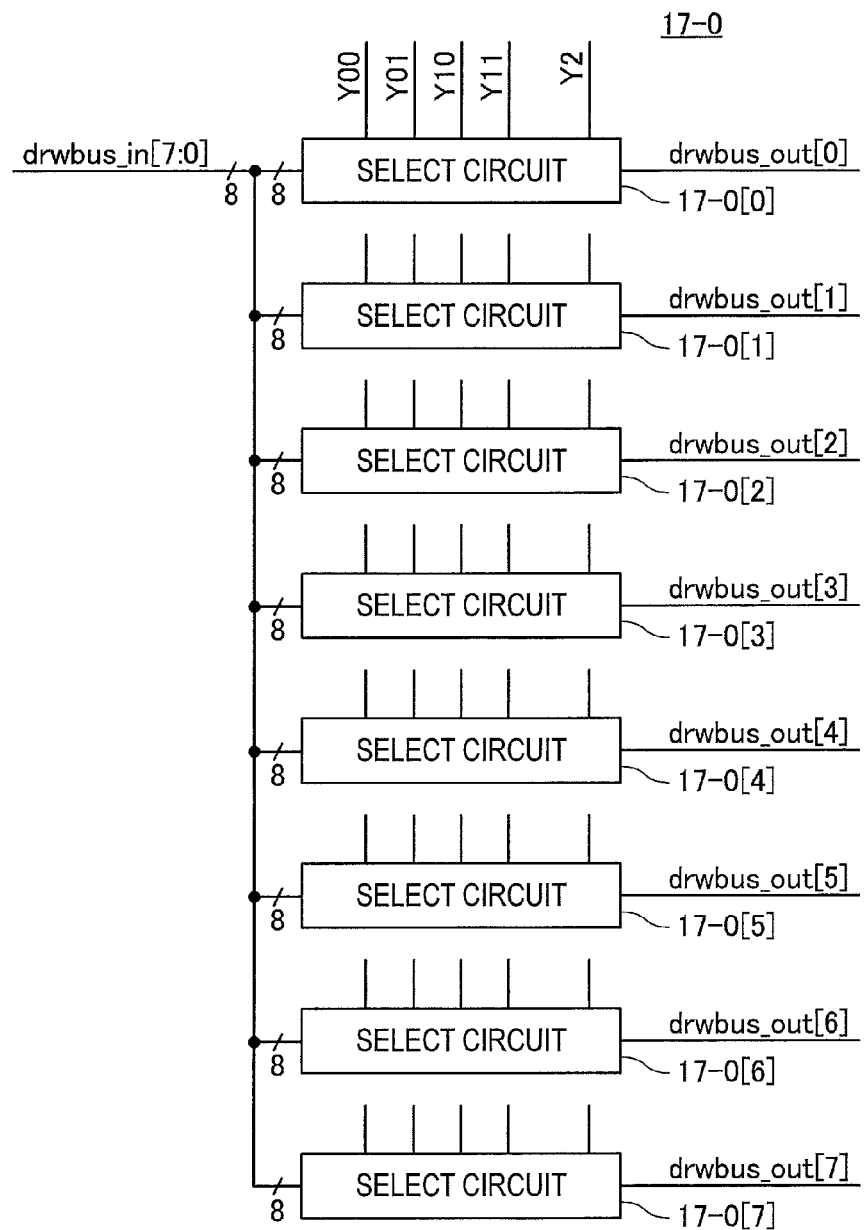
FIG. 8 is a circuit diagram of the BOC circuit 17-0 shown in FIG. 6.

Turning to FIG. 8, although not shown in the diagram, the BOC circuits 17-1 to 17-7 have the same configuration as the described BOC circuits 17-0.

As shown in FIG. 8, the BOC circuit 17-0 includes eight select circuits 17-0[7:0]. The select circuits 17-0[7:0] are each connected with all the eight lines of the data bus drwbus_in[7:0] and a corresponding line of the data bus drwbus_out [7:0]. The select circuits 17-0[7:0] each have the function of selecting any one of the eight lines of the data bus drwbus_in[7:0] according to the column address Y0, Y1, and Y2, and connecting the selected line to the corresponding data bus drwbus_out[7:0].

A detailed description will be given below with a focus on the select circuit 17-0[0]. As shown in FIG. 8, the select circuit 17-0[0] is supplied with the column address Y2 and address information Y00, Y01, Y10, and Y11. The address information Y00, Y01, Y10, and Y11 is information generated inside the BOC circuit 17 based on the column address Y0 and Y1 supplied from the control circuit 30 (FIG. 4).

Figure 9:
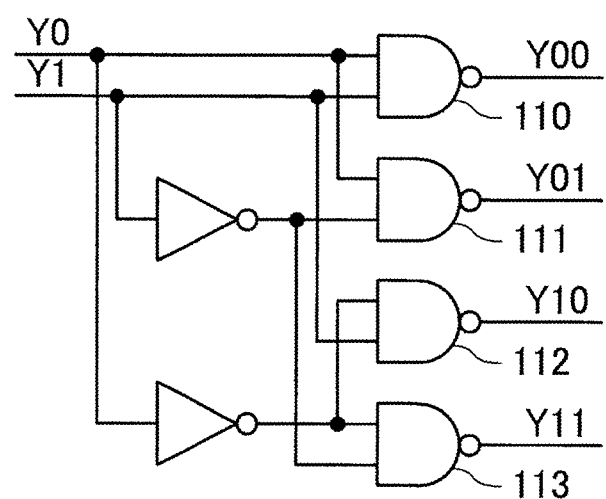
FIG. 9 is a circuit diagram of the circuit that generates the address information Y00, Y01, Y10, and Y11 shown in FIG. 8.

As shown in FIG. 9, the BOC circuit 17 includes NAND circuits 110 to 113. The column address Y0 and Y1 is supplied to the NAND circuit 110. The column address Y0 and the inverted signal of the column address Y1 are supplied to the NAND circuit 111. The inverted signal of the column address Y0 and the column address Y1 are supplied to the NAND circuit 112. The inverted signals of the respective column address Y0 and Y1 are supplied to the NAND circuit 113. With such a configuration, the pieces of address information Y00, Y01, Y10, and Y11 become "0" when the combination of the column address Y0 and Y1 is (1,1), (1,0), (0,1), and (0,0), respectively, and "1" in the other cases.

Figure 10:
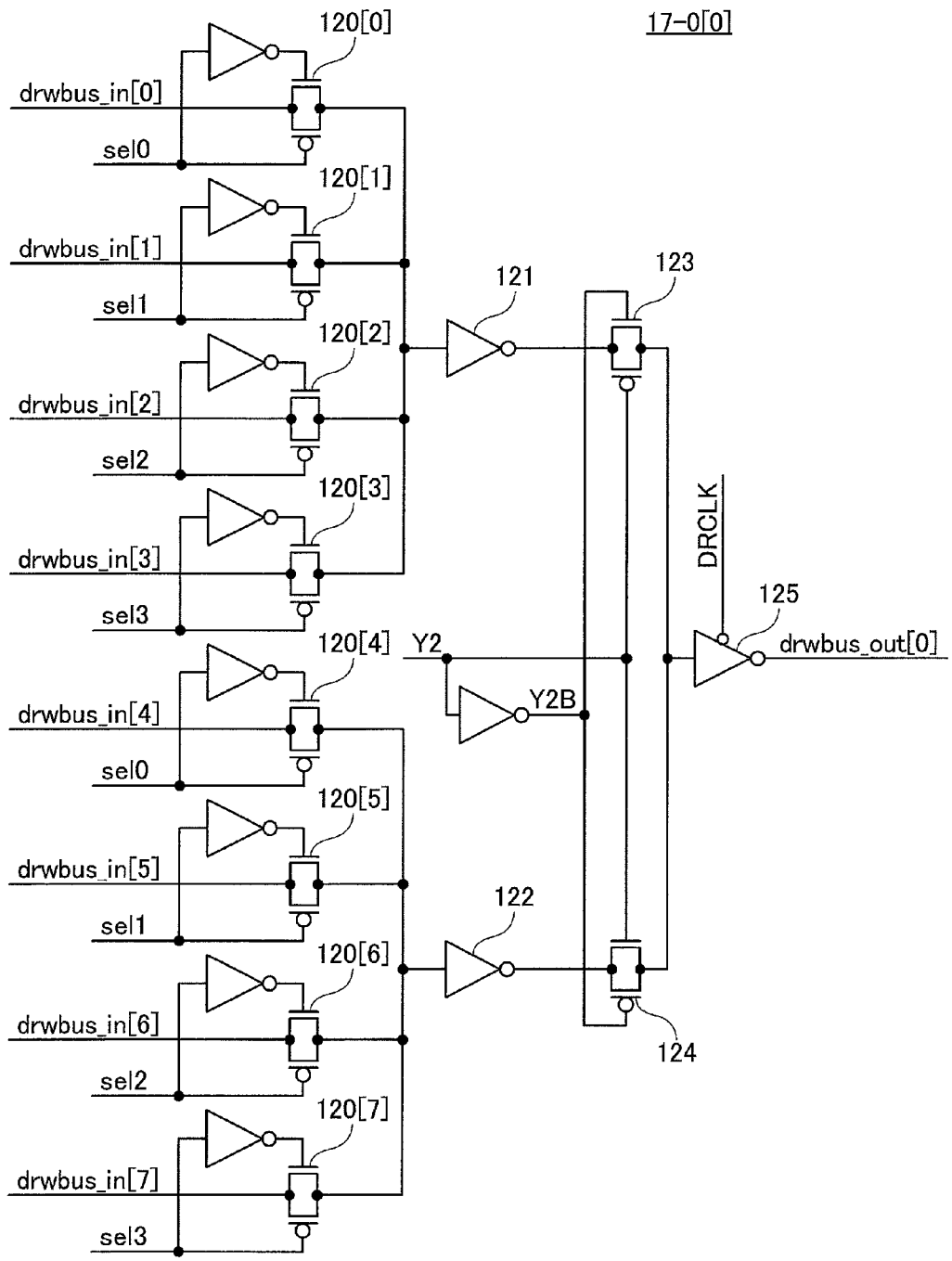
FIG. 10 is a circuit diagram of the select circuit 17-0[0] shown in FIG. 8.

Return to the description of the select circuit 17-0[0]. As shown in FIG. 10, select signals sel0 to sel3 are supplied to the select circuit 17-0[0]. The select signals sel0 to sel3 are signals generated by a not-shown circuit in the select circuit 17-0[0]. The combinations of the values of the select signals sel0 to sel3 are determined in advance in association with the combinations of the values of the address information Y00, Y01, Y10, and Y11 on a one-to-one basis. Table 1 shows an example of the associations. For example, when the address information Y00, Y01, Y10, and Y11 is (0,1,1,1), the select signals sel0 to sel3 are (1,1,1,0). The select circuits 17-0[7:0] each store associations like Table 1. The select circuits 17-0 [7:0] read the select signals sel0 to sel3 associated with the input address information Y00, Y01, Y10, and Y11, and use the select signals sel0 to sel3 for the processing to be described below.

TABLE 1

| Y00 | Y01 | Y10 | Y11 | sel0 | sel1 | sel2 | sel3 |
|---|---|---|---|---|---|---|---|
| 0 | 1 | 1 | 1 | 1 | 1 | 1 | 0 |
| 1 | 0 | 1 | 1 | 1 | 1 | 0 | 1 |
| 1 | 1 | 0 | 1 | 1 | 0 | 1 | 1 |
| 1 | 1 | 1 | 0 | 0 | 1 | 1 | 1 |
| 0 | 1 | 1 | 1 | 1 | 1 | 1 | 0 |
| 1 | 0 | 1 | 1 | 1 | 1 | 0 | 1 |
| 1 | 1 | 0 | 1 | 1 | 0 | 1 | 1 |
| 1 | 1 | 1 | 0 | 0 | 1 | 1 | 1 |

As shown in FIG. 10, the select circuit 17-0[0] includes transfer gates 120[7:0], 123, and 124, and inverter circuits 121, 122, and 125. Each transfer gate includes a P-channel MOS transistor and an N-channel MOS transistor which are connected in parallel.

The select signal sel0 and the inverted signal of the select signal sel0 are supplied to the gates of the P-channel MOS transistor and the N-channel MOS transistor constituting the transfer gate 120[0], respectively. The transfer gate 120[0] thus becomes conducting if the select signal sel0 has a logic level of "0". The transfer gate 120[0] becomes non-conducting if the select signal sel0 has a logic level of "1".

The same holds for the other transfer gates 120. In summary, the transfer gates 120[1] and 120[5] become conducting if the select signal sel1 has a logic level of "0", and become non-conducting if "1". The transfer gates 120[2] and 120[6] become conducting if the select signal sel1 has a logic level of "0", and become non-conducting if "1". The transfer gates 120[3] and 120[7] become conducting if the select signal sel3 has a logic level of "0", and become non-conducting if "1". Like the transfer gate 120[0], the transfer gate 120[4] becomes conducting if the select signal sel0 has a logic level of "0", and becomes non-conducting if "1".

The input terminals of the transfer gates 120[7:0] are connected to the data bus drwbus_in[7:0], respectively. The output terminals of the transfer gates 120[3:0] are connected in common to the input terminal of the transfer gate 123 through the inverter circuit 121. The output terminals of the transfer gates 120[7:4] are connected in common to the input terminal of the transfer gate 124 through the inverter circuit 122.

As illustrated in Table 1, the select signals sel0 to sel3 are configured so that anyone of the select signals sel0 to sel3 becomes "0" while the others are "1". The input terminal of the transfer gate 123 is thus connected with only one of the lines of the data bus drwbus_in[3:0]. Similarly, the input terminal of the transfer gate 124 is connected with only one of the lines of the data bus drwbus_in[7:4].

The column address Y2 and the inverted signal Y2B of the column address Y2 are supplied to the gates of the P-channel MOS transistor and the N-channel MOS transistor constituting the transfer gate 123, respectively. Consequently, the transfer gate 123 becomes conducting if the column address Y2 has a logic level of "0", and becomes non-conducting if "1".

Meanwhile, the inverted signal Y2B of the column address Y2 and the column address Y2 are supplied to the gates of the P-channel MOS transistor and the N-channel MOS transistor constituting the transfer gate 124, respectively. Consequently, the transfer gate 124 becomes conducting if the column address Y2 has a logic level of "1", and becomes non-conducting if "0".

The output terminals of the transfer gates 123 and 124 are connected in common to the input terminal of the inverter circuit 125. The inverted signal of the read control clock signal DRCLK is supplied to the inverter circuit 125. The inverter circuit 125 connects the output terminals of the transfer gates 123 and 124 to the data bus drwbus_out[0] at timing corresponding to the read control clock signal DRCLK.

Suppose, for example, that the address information Y00, Y01, Y10, and Y11 and the select signals sel0 to sel3 are associated as shown in Table 1. By the foregoing configuration, the data bus drwbus_out[0] is connected with the data bus drwbus_in shown by the following Table 2 depending on the combination of the column address Y0, Y1, and Y2. The select circuit 17-0[0] can thus connect any one of the eight lines of the data bus drwbus_in[7:0] to the data bus drwbus_out[0] in accordance with the column address Y0, Y1, and Y2.

TABLE 2

| Y2 | Y1 | Y0 | data bus connecting to data bus drwbus_out[0] |
|---|---|---|---|
| 1 | 1 | 1 | drwbus_in[7] |
| 1 | 1 | 0 | drwbus_in[6] |
| 1 | 0 | 1 | drwbus_in[5] |
| 1 | 0 | 0 | drwbus_in[4] |
| 0 | 1 | 1 | drwbus_in[3] |
| 0 | 1 | 0 | drwbus_in[2] |
| 0 | 0 | 1 | drwbus_in[1] |
| 0 | 0 | 0 | drwbus_in[0] |

As described above, the select circuit 17-0[0] is a circuit that controls the data to be supplied to the data bus drwbus_out[0]. The other select circuits 17-0[7:1] control the data to be supplied to the data bus drwbusout [7:1], respectively. The output order in which the eight bits of read data DQ are burst output from the data input/output terminal 54[0] can thus be rearranged (BOC) in accordance with the column address Y0, Y1, and Y2 by changing the associations of the select signals sel0 to sel3 with the address information Y00, Y01, Y10, and Y11 from one to another of the select circuits 17-0[7:0] so that the pieces of data supplied to the data bus drwbus_out[7:0] do not overlap each other.

Return to FIG. 6. The DBI circuit 18 is connected to the 64 lines of the data bus drwbus_out[63:0], the 64 lines of the read/write bus RWBUS_DQ[63:0], and the eight lines of the read/write bus RWBUS_DBI[7:0]. At the time of reading, the DBI circuit 18 functions to invert the read data DQ input through the data bus drwbus_out in accordance with a predetermined condition and generate DBI data that indicates information on the inversion. At the time of writing, the DBI circuit 18 performs processing for re-inverting and restoring inverted pieces of write data DQ that is input from outside through the read/write bus RWBUS_DQ, in accordance with DBI data that is input from outside through the read/write bus RWBUS_DBI. A read-related configuration will be described below.

Figure 11:
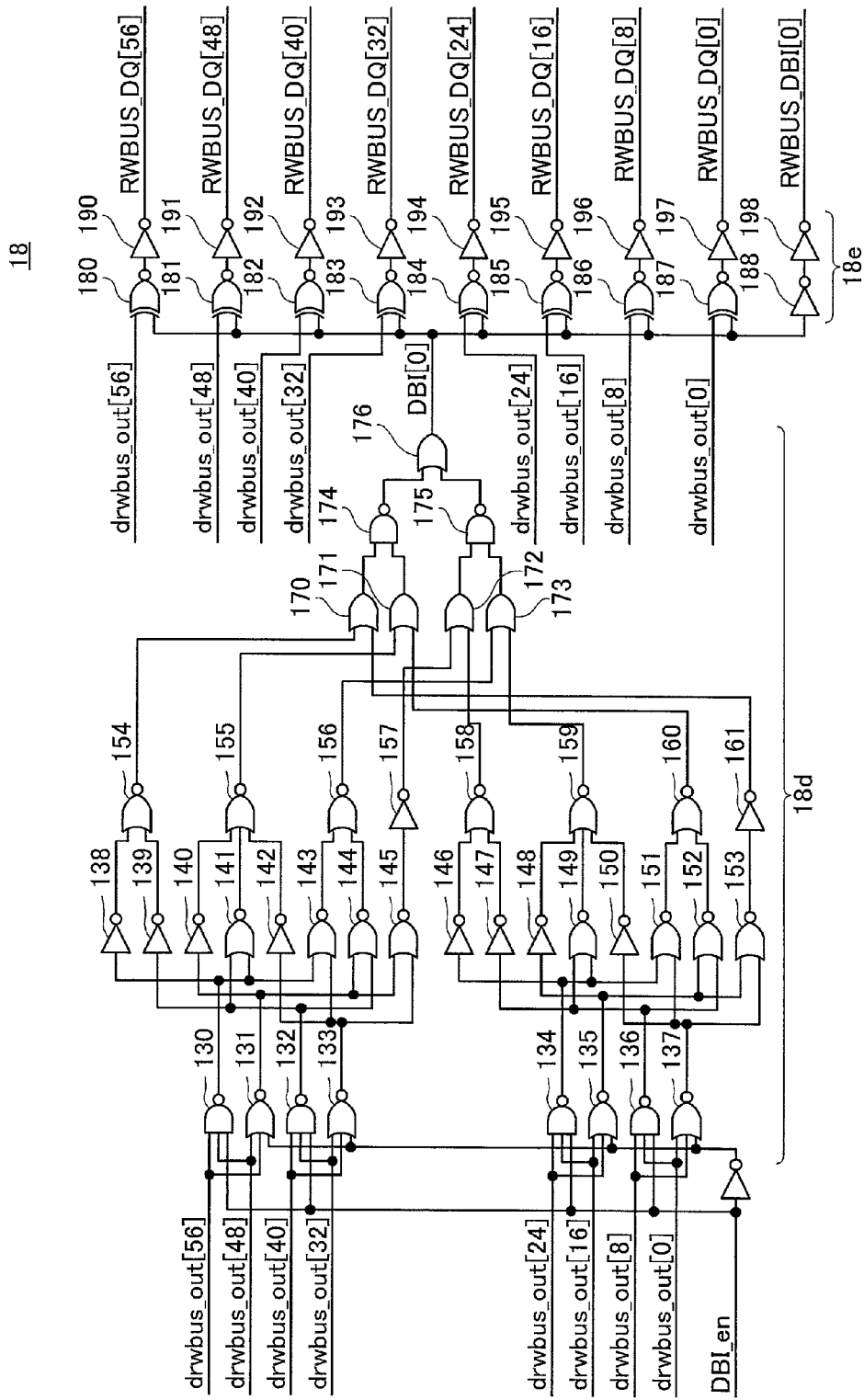
FIG. 11 is a circuit diagram of the DBI circuit 18 shown in FIG. 6.

Turning to FIG. 6, the DBI circuit 18 includes one internal circuit for each order of the burst output. FIG. 11 shows only the internal circuit corresponding to the zeroth output order. The internal circuits corresponding to the other output orders have the same configuration. FIG. 11 only shows the read-related configuration. A write-related configuration is omitted. As has been described with reference to FIG. 2, the read data corresponding to the zeroth output order includes the eight pieces of read data DQ[8·0+0] to DQ[8·7+0] (read data DQ[0] to DQ[56]).

As shown in FIG. 11, the DBI circuit 18 includes a majority circuit 18d and a majority circuit 18e. The majority circuit 18d will initially be described. The majority circuit 18d includes NAND circuits 130, 132, 134, 136, 174, and 175, NOR circuits 131, 133, 135, 137, 141, 143, 144, 145, 149, 151, 152, 153, 154, 155, 156, 158, 159, and 160, inverter circuits 138, 139, 140, 142, 146, 146, 148, 150, 157, 161, and OR circuits 170, 171, 172, 173, and 176. The connections of such circuits will be described below.

The data bus drwbus_out[56] and the data bus drwbus_out[48] are connected to and the DBI enable signal DBI_en is supplied to the input terminals of the NAND circuit 130. The data bus drwbus_out[56] and the data bus drwbus_out[48] are connected to and the inverted signal of the DBI enable signal DBI_en is supplied to the input terminals of the NOR circuit 131. The data bus drwbus_out[40] and the data bus drwbus_out[32] are connected to and the DBI enable signal DBI_en is supplied to the input terminals of the NAND circuit 132. The data bus drwbus_out[40] and the data bus drwbus_out[32] are connected to and the inverted signal of the DBI enable signal DBI_en is supplied to the input terminals of the NOR circuit 133. The data bus drwbus_out [24] and the data bus drwbus_out [16] are connected to and the DBI enable signal DBI_en is supplied to the input terminals of the NAND circuit 134. The data bus drwbus_out[24] and the data bus drwbus_out[16] are connected to and the inverted signal of the DBI enable signal DBI_en is supplied to the input terminals of the NOR circuit 135. The data bus drwbus_out [8] and the data bus drwbus_out[0] are connected to and the DBI enable signal DBI_en is supplied to the input terminals of the NAND circuit 136. The data bus drwbus_out[8] and the data bus drwbus_out[0] are connected to and the inverted signal of the DBI enable signal DBI_en is supplied to the input terminals of the NOR circuit 137.

The output signal of the NAND circuit 130 is supplied to the inverter circuit 138 and the NOR circuits 141 and 143. The output signal of the NOR circuit 131 is supplied to the inverter circuit 140 and the NOR circuits 144 and 145. The output signal of the NAND circuit 132 is supplied to the inverter circuit 139 and the NOR circuits 141 and 144. The output signal of the NOR circuit 133 is supplied to the inverter circuit 142 and the NOR circuits 143 and 145. The output signal of the NAND circuit 134 is supplied to the inverter circuit 146 and the NOR circuits 149 and 151. The output signal of the NOR circuit 135 is supplied to the inverter circuit 148 and the NOR circuits 152 and 153. The output signal of the NAND circuit 136 is supplied to the inverter circuit 147 and the NOR circuits 149 and 152. The output signal of the NOR circuit 137 is supplied to the inverter circuit 150 and the NOR circuits 151 and 153.

The output signals of the inverter circuits 138 and 139 are supplied to the input terminals of the NOR circuit 154. The output signals of the inverter circuits 140 and 142 and the NOR circuit 141 are supplied to the input terminals of the NOR circuit 155. The output signals of the NOR circuits 143 and 144 are supplied to the input terminals of the NOR circuit 156. The output signal of the NOR circuit 145 is supplied to the input terminal of the inverter circuit 157. The output signals of the inverter circuits 146 and 147 are supplied to the input terminals of the NOR circuit 158. The output signals of the inverter circuits 148 and 150 and the NOR circuit 149 are supplied to the input terminals of the NOR circuit 159. The output signals of the NOR circuits 151 and 152 are supplied to the input terminals of the NOR circuit 160. The output signal of the NOR circuit 153 is supplied to the input terminal of the inverter circuit 161.

The output signals of the NOR circuit 154 and the inverter circuit 161 are supplied to the input terminals of the OR circuit 170. The output signals of the NOR circuits 155 and 160 are supplied to the input terminals of the OR circuit 171. The output signals of the inverter circuit 157 and the NOR circuit 158 are supplied to the input terminals of the OR circuit 172. The output signals of the NOR circuits 156 and 159 are supplied to the input terminals of the OR circuit 173.

The output signals of the OR circuits 170 and 171 are supplied to the input terminals of the NAND circuit 174. The output signals of the OR circuits 172 and 173 are supplied to the input terminals of the NAND circuit 175. Finally, the output signals of the NAND circuits 174 and 175 are supplied to the input terminal of the OR circuit 176. The output signal of the OR circuit 176 constitutes the DBI data DBI[0] corresponding to the zeroth output order.

According to the configuration of the majority circuit 18$d$ described above, the logic level of the DBI data DBI[0] always becomes "0" if the number of pieces of read data DQ that have a logic level of "0" among the eight pieces of read data DQ[8·0+0] to DQ[8·7+0] corresponding to the zeroth output order is greater than or equal to five (more than half). The logic level of the DBI data DBI[0] always becomes "1" if the number is smaller than or equal to three (less than half). If the number of pieces of read data DQ having a logic level of "0" is four (the exact half), the logic level of the DBI data DBI[0] may become "0" or "1". This, however, does not matter because inverting the read data by DBI causes no change in the number of 0s.

Next, the majority circuit 18$e$ will be described. As shown in FIG. 11, the majority circuit 18$e$ includes XNOR circuits 180 to 187 and inverter circuits 188 and 190 to 198.

The data bus drwbus_out [8·7] to drwbus_out [8·0] and the DBI data DBI[0] are supplied to the input terminals of the XNOR circuits 180 to 187. The DBI data DBI[0] is also supplied to the input terminal of the inverter circuit 188. The output signals of the XNOR circuits 180 to 187 and the inverter circuit 188 are supplied to the inverter circuits 190 to 198, respectively. The output terminals of the inverter circuits 190 to 198 are supplied to the read/write bus RWBUS_DQ [8·7] to RWBUS_DQ[8·0] and the read/write bus RWBUS_DBI[0], respectively.

The inverter circuits 190 to 198 are supplied with the inverted signal of the read control clock signal DRCLK (not shown). When the read control clock signal DRCLK is activated, the inverter circuits 190 to 198 output the inverted signals of the corresponding XNOR circuits and the inverter circuit to the respective corresponding lines of the read/write bus RWBUS_DQ.

With the foregoing configuration, the majority circuit 18$e$ simply supplies the data on the data bus drwbus_out[8·0+0] to drwbus_out[8·7+0] to the read/write bus RWBUS_DQ[8·0] to RWBUS_DQ[8·7], respectively, if the DBI data DBI [0] is "1." On the other hand, if the DBI data DBI[0] is "0," the majority circuit 18$e$ inverts the data on the data bus drwbus_out[8·0+0] to drwbus_out[8·7+0] and outputs the resultant to the read/write bus RWBUS_DQ[8.0] to RWBUS_DQ [8·7], respectively. As a result, when five or more of the eight bits (DQ0 to DQ7) of read data to be simultaneously output are "0", all the eight bits are inverted (DBI).

The specific configurations and functions of the circuits shown in FIG. 5 have been described so far. Next, the operation of the semiconductor device 1 will be described with reference to an operation waveform chart.

Figure 12:
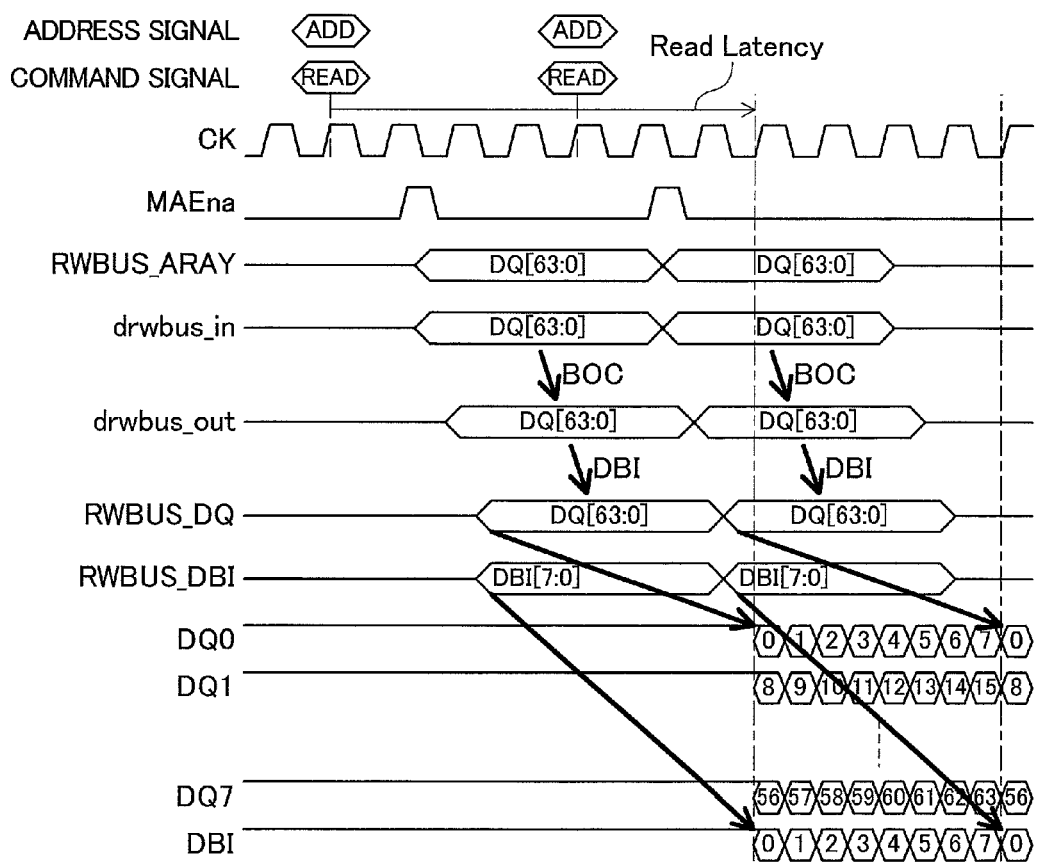
FIG. 12 is an operation waveform chart of the semiconductor device 1 shown in FIG. 4 at the time of reading.

FIG. 12 shows an example where two read commands READ are supplied from outside to the semiconductor device 1 in succession. The following description will be given also with reference to FIG. 4.

As shown in FIG. 12, when an address signal ADD and a read command READ are supplied from an external controller, the main amplifiers 13 corresponding to the bank address BA included in the address signal ADD are activated. Read data DQ[63:0] is supplied from the corresponding memory array 11 to the read/write bus RWBUS_ARAY.

The read data DQ[63:0] is supplied to the data bus drwbus_in[63:0] through the RWBUS control circuit 16. The BOC circuit 17 rearranges the output order of the pieces of read data for each data input/output terminal 54, and outputs the resultant to the data bus drwbus_out[63:0].

The DBI circuit 18 then converts the read data DQ[63:0] so that five or more of eight bits (DQ0 to DQ7) of the read data to be simultaneously output are "1," and outputs the resultant to the read write bus RWBUS_DQ[63:0]. The DBI circuit 18 simultaneously generates DBI data DBI[7:0] indicating whether the read data is inverted, and outputs the DBI data DBI[7:0] to the read/write bus RWBUS_DBI[7:0].

The read data DQ[63:0] and the DBI data DBI[7:0] thus output to the respective read/write buses are supplied to the input/output circuit 19. As shown in FIG. 12, the read data DQ[63:0] and the DBI data DBI[7:0] are burst output from the corresponding data input/output terminals 54 and DBI terminal 55 in units of eight bits in synchronization with the external clock CK after a predetermined read latency ("7" in the example of FIG. 12).

As has been described above, according to the semiconductor device 1 of the present embodiment, the provision of the DBI circuit 18 between the BOC circuit 17 and the input/output circuit 19 eliminates the need for a BOC circuit 17 that is intended to rearrange the order of the DBI data.

Figure 13:
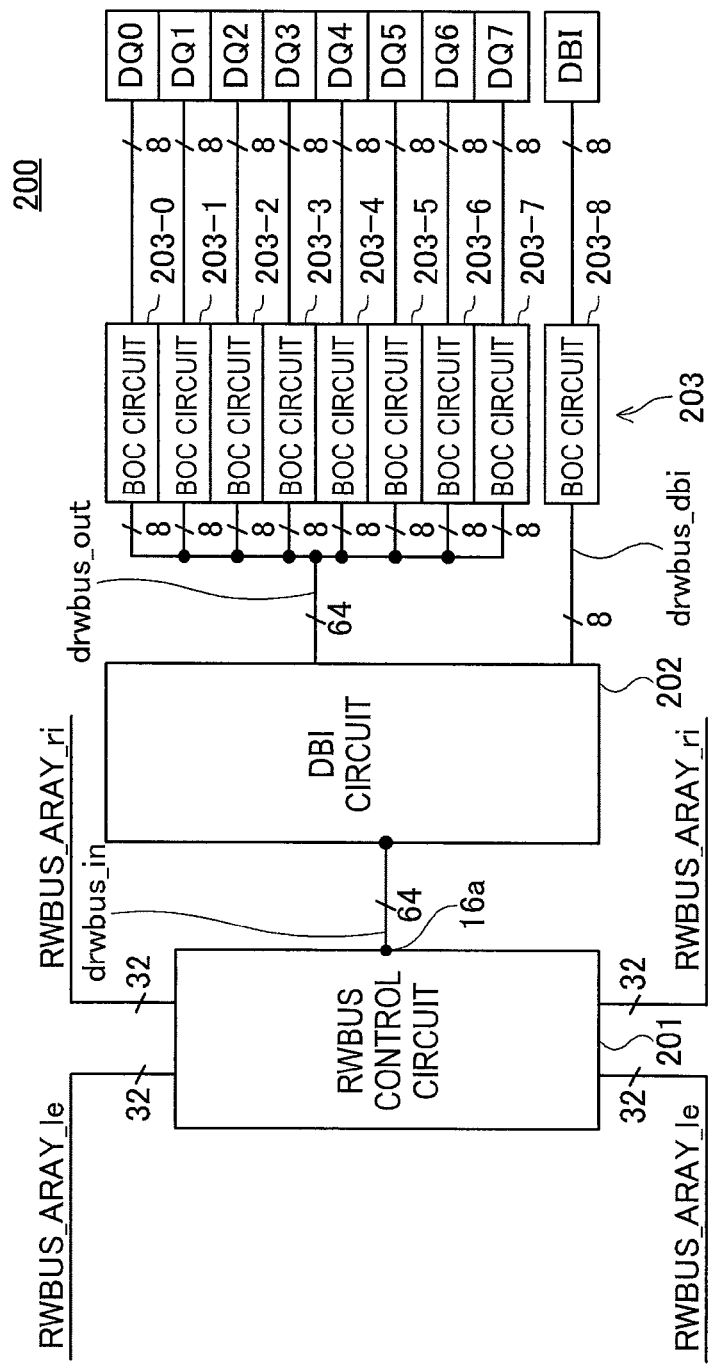
FIG. 13 is a diagram showing a semiconductor device 200 according to the comparative example.

The advantage of the embodiment of the present invention will be described in conjunction with the configuration of a semiconductor device 200 shown in FIG. 13 that the inventor has studied as a comparative example. FIG. 13 corresponds to FIG. 6 which shows the semiconductor device 1 according to the present embodiment. As shown in FIG. 13, the semiconductor device 200 includes a DBI circuit 202 between a BOC circuit 203 and an RWBUS control circuit 201. According to the configuration, as shown in FIG. 13, a data bus drwbus_dbi needs to be arranged between the DBI circuit 202 and the BOC circuit 202, and the BOC circuit 202 needs to include a ninth BOC circuit 202-8. The DBI circuit 202 generates eight bits of DBI data corresponding to respective orders of output (n) from the 64 bits of data on the data bus drwbus_in[63:0]. Since the DBI data also needs to be rearranged by the BOC circuit 203, the BOC circuit 203 needs to include the ninth BOC circuit 203-8. The semiconductor device 1 according to the present embodiment does not need such components. The presence of the data bus drwbus_dbi and the BOC circuit 203-8 increases the circuit area and power consumption of the semiconductor device 200 as compared to the semiconductor device 1.

The semiconductor device 1 according to the present embodiment thus has a reduced circuit area and power consumption as compared to the semiconductor device 200 according to the comparative example.

Figure 14:
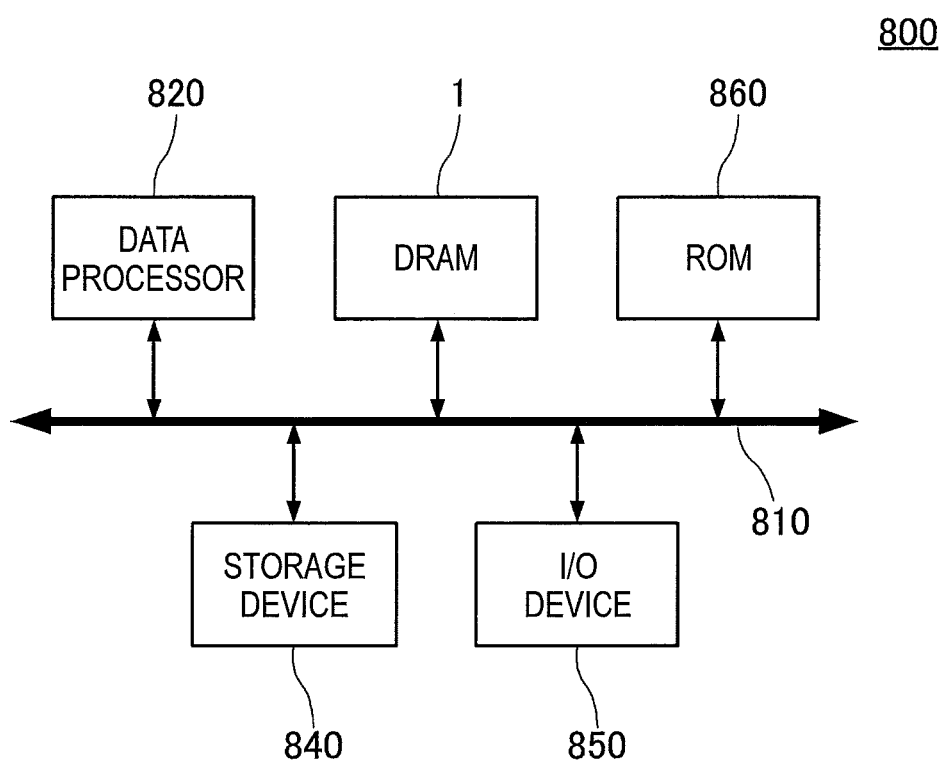
FIG. 14 is a block diagram showing the configuration of a data processing system 800 that uses the semiconductor device 10 of the present embodiments.

Turning to FIG. 14, the data processing system 800 includes a structure in which the following components are connected to each other via a system bus 810: a data processor 820 (controller); a DRAM 1, which is the semiconductor device 1 of the present embodiment; a storage device 840; an I/O device 850; and a ROM 860.

The data processor 820 includes a function of supplying external clock signals CK and /CK to the DRAM 10, and a function of receiving an output signal (read data DQ) of the input/output circuit 19 (FIG. 4) of the DRAM 1 and performing a process corresponding to the received read data DQ. More specifically, for example, the following can be used as the data processor 820: a microprocessor (MPU), a digital signal processor (DSP), and the like. Incidentally, the data processor 820 and the DRAM 1 may be connected to each other by a local bus, not via the system bus 810.

As the storage device 840, a hard disk drive, an optical disc drive, a flash memory, or the like may be used. As the I/O device 850, a display device such as a liquid crystal display, an input device such as a keyboard and mouse, or the like may be used. Incidentally, the I/O device 850 may be either an input device or an output device.

FIG. 14 shows only one system bus 810 for ease of explanation. However, a plurality of system buses 810 may be provided in a serial or parallel manner via a connector or the like, if necessary. The storage device 840, the I/O device 850, and the ROM 860 are not necessarily essential components. Furthermore, in FIG. 14, for ease of explanation, there is only one depicted per each type of component. However, the present invention is not limited to the above case. As for one, two, or more types of component, there may be provided more than one per type.

It is apparent that the present invention is not limited to the above embodiments, but may be modified and changed without departing from the scope and spirit of the invention.

The memory cells according to the present invention may be volatile, nonvolatile, or a combination of these.

The technical concept of the present invention may be applied to a semiconductor device that includes a signal transmission circuit. The forms of the circuits in the circuit blocks disclosed in the drawings and other circuits for generating the control signals are not limited to the circuit forms disclosed in the embodiment.

The technical concept of the present invention can be applied to various types of semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), an ASSP (Application Specific Standard Circuit), and a Memory. An SOC (System on Chip), an MCP (Multi Chip Package) and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

The following supplementary notes provide another possible configurations of the present invention.

A data processing system according to an aspect of the present invention includes: a semiconductor device including a plurality of first data lines that transmit a plurality of sequential first data bits, respectively, a plurality of second data lines that transmit a plurality of sequential second data bits, respectively, a plurality of third data lines that transmit a plurality of sequential third data bits, respectively, a BOC circuit that rearranges order of the plurality of first data bits supplied from the plurality of first data lines in accordance with address information, and supplies the resultant to the plurality of second data lines as the plurality of second data bits, and a DBI circuit that performs inversion or non-inversion of the plurality of second data bits supplied from the plurality of second data lines independently of each other in accordance with a predetermined condition, and supplies the resultant to the plurality of third data lines as the plurality of third data bits; and a controller that controls the semiconductor device.

The data processing system may be configured such that: the semiconductor device includes a mode register that stores an operation mode signal indicating an operation mode; the DBI circuit performs inversion processing in accordance with the operation mode indicated by the operation mode signal; and the controller sets the operation mode signal into the mode register.

What is claimed is:
1. A device comprising:
 a plurality of first data lines transmitting a plurality of first data bits;
 a plurality of second data lines transmitting a plurality of second data bits;
 a plurality of third data lines transmitting a plurality of third data bits;
 a BOC circuit converting the first data bits into the second data bits by rearranging order of the first data bits based on address information;

a DBI circuit converting the second data bits into the third data bits by performing inversion or non-inversion in logic level of each of the second data bits based on a predetermined rule; and
an output circuit outputting the third data bits in serial.

2. The device as claimed in claim 1, further comprising a plurality of fourth data lines transmitting a plurality of fourth data bits, wherein
the DBI circuit generates the fourth data bits each indicating whether an associated one of the third data bits is inverted in logic level or not, and
the output circuit outputs the fourth data bits in serial.

3. The device as claimed in claim 1, further comprising a bypass circuit connecting the first data lines and the second data lines in response to a write control signal,
wherein the BOC circuit performs the rearranging order of the first data bits in response to a read control signal.

4. The device as claimed in claim 1, wherein the DBI circuit inverts the second data bits to generate the third data bits when a number of the third data bits to be simultaneously output having a first logic level is greater than a predetermined value.

5. The device as claimed in claim 4, wherein the DBI circuit includes:
a majority circuit activating a DBI signal when a number of second data bits simultaneously supplied from a part of the second data lines having the first logic level is greater than the predetermined value; and
an inversion processing circuit inverting the second data bits in logic level to generate the third data bits to be simultaneously output when the DBI signal is activated.

6. The device as claimed in claim 4, wherein the predetermined value is greater than half the number of the second data bits simultaneously supplied from the part of the second data lines.

7. The device as claimed in claim 1, wherein
the BOC circuit includes a plurality of select circuits each assigned to respective plurality of second data lines, and
each of the select circuits includes a plurality of transfer gates being coupled between at least a part of the first data lines and corresponding one of the second data lines, respectively, each of the select circuits making one of the plurality of transfer gates conducting and the others non-conducting in accordance with the address information.

8. The device as claimed in claim 1, further comprising:
a plurality of memory banks;
first pad electrodes receiving the address information; and
second pad electrodes outputting the third data bits, wherein
each of the memory banks includes a first memory array being arranged closer to one end of the device in a second direction and a second memory array being arranged closer to the other end of the device in the second direction, and
the first and second pad electrodes are arranged in a wiring area arranged between the first memory array and the second memory array.

9. The device as claimed in claim 8, further comprising a plurality of fourth data lines transmitting a plurality of fourth data bits, respectively, wherein
the DBI circuit generates the fourth data bits each indicating whether an associated one of the third data bits is inverted in logic level or not, and
the output circuit outputting the fourth data bits via the second pad electrodes.

10. The device as claimed in claim 8, further comprising a central control circuit including the BOC circuit and the DBI circuit, the central control circuit being arranged in a part of the wiring area.

11. The device as claimed in claim 10, wherein the first pad electrodes and the second pad electrodes are arranged on respective opposite sides of the central control circuit in a first direction substantially perpendicular to the second direction.

12. The device as claimed in claim 10, wherein
the plurality of banks include a group of first banks arranged on one side of the device in a first direction substantially perpendicular to the second direction and a group of second banks arranged on the other side of the device in the first direction,
the device further includes:
a plurality of fifth data lines connecting the central control circuit to the group of first banks; and
a plurality of sixth data lines connecting the central control circuit to the group of second banks, and
the central control circuit further includes a multiplexer connecting either one of the fifth data lines and the sixth data lines to the first data lines in accordance with the address information.

13. The device as claimed in claim 1, further comprising a plurality of memory banks supplying the first data bits to the first data lines,
wherein the second data lines are shorter than the first data lines.

14. The device as claimed in claim 8, wherein the second data lines are shorter than the third data lines.

15. A device comprising:
a memory array outputting first read data;
a BOC circuit rearranging order of the first read data to generate second read data;
a DBI circuit inverting one or ones of the second read data in logic level in accordance with a predetermined rule to generate third read data; and
a plurality of data input/output terminals outputting the third read data to outside.

16. The device as claimed in claim 15, wherein
each of the first, second and third read data include a plurality of first bits to be sequentially outputted from one of the input/output terminals and a plurality of second bits to be outputted in parallel from the data input/output terminals,
the BOC circuit rearranges order of the first bits, and
the DBI circuit inverts one or ones of the second bits in logic level.

17. The device as claimed in claim 15, further comprising a DBI terminal,
wherein the DBI circuit generates DBI data indicating whether the third read data are inverted, the DBI circuit outputting the DBI data to the DBI terminal.

18. The device as claimed in claim 15, wherein
the second read data are divided into a plurality of bit group, each of the bit group is assigned to an associated one of the data input/output terminals, and
the BOC circuit performs the rearranging order in the same bit group.

19. The device as claimed in claim 17, wherein the DBI circuit inverts all the read data to be simultaneously output from the data input/output terminals in parallel depending on whether a number of read data having a first logic level among the read data to be simultaneously output from the data input/output terminals in parallel is greater than a predetermined value.

20. A device comprising:
a burst order control circuit configured to receive a first data signal and then a second data signal, each of the first and second data signals including a plurality of bits, and output the second data signal and then the first data signal based on a control signal; and
an inversion control circuit configured to receive the second data signal and then the first data signal and output the second data signal and then the first data signal, the bits of one of the second and first data signals being non-inverted based on a first information and the bits of the other of the bits of the second and first data signal being inverted based on a second information, the first and second information being obtained from the respective bits of the second and first data signals, the first and second information being output from the inversion control circuit.

* * * * *